United States Patent
Tsai

(10) Patent No.: US 9,030,814 B2
(45) Date of Patent: May 12, 2015

(54) SCREWLESS CARRYING FRAME FOR DATA ACCESS DEVICES

(71) Applicant: AIC Inc., Taoyuan Hsien (TW)

(72) Inventor: Lin-Kuei Tsai, Taoyuan Hsien (TW)

(73) Assignee: AIC Inc., Taoyuan Hsien (TW)

( * ) Notice: Subject to any disclaimer, the term of this patent is extended or adjusted under 35 U.S.C. 154(b) by 162 days.

(21) Appl. No.: 13/924,917

(22) Filed: Jun. 24, 2013

(65) Prior Publication Data

US 2014/0374366 A1   Dec. 25, 2014

(51) Int. Cl.
  *G06F 1/16* (2006.01)
  *H05K 7/14* (2006.01)
  *G11B 33/00* (2006.01)

(52) U.S. Cl.
  CPC .............. *H05K 7/1487* (2013.01); *G11B 33/00* (2013.01)

(58) Field of Classification Search
  CPC ............................. G06F 1/187; H05K 7/1489
  USPC ..................................................... 361/679.37
  See application file for complete search history.

(56) References Cited

U.S. PATENT DOCUMENTS

| | | | | |
|---|---|---|---|---|
| 5,768,099 A | * | 6/1998 | Radloff et al. | 361/679.31 |
| 5,943,208 A | * | 8/1999 | Kato et al. | 361/679.31 |
| 6,075,695 A | * | 6/2000 | Konno et al. | 361/679.31 |
| 6,141,222 A | * | 10/2000 | Toor et al. | 361/726 |
| 6,751,093 B1 | * | 6/2004 | Hsu et al. | 361/679.33 |
| 7,017,875 B2 | * | 3/2006 | Chen et al. | 248/300 |
| 7,355,846 B1 | * | 4/2008 | Chen et al. | 361/679.33 |
| 2004/0047122 A1 | * | 3/2004 | Chen et al. | 361/685 |
| 2007/0019377 A1 | * | 1/2007 | Chen et al. | 361/685 |
| 2008/0144275 A1 | * | 6/2008 | Chen et al. | 361/685 |
| 2011/0031362 A1 | * | 2/2011 | Chang | 248/220.21 |

* cited by examiner

*Primary Examiner* — Anthony Q Edwards
(74) *Attorney, Agent, or Firm* — Chun-Ming Shih; HDLS IPR Services

(57) ABSTRACT

A screwless carrying frame for data access devices is fixed to a bottom board and includes a first frame body having an upper structure with an upper vertical plate and an upper transverse plate connected into a step shape. The upper vertical plate has elastic packing elements, and the upper transverse plate has elastic support elements. A second frame body is installed at the bottom board and connected to the first frame body and includes an upper structure with an upper riser plate and an upper horizontal plate connected into a step shape. An upper carrying space is formed between two upper structures of the first and second frame bodies for accommodating the data access device. The elastic packing element is elastically packed at a lateral side of the data access device and the elastic support element is elastically supported at a bottom side of the data access device.

16 Claims, 7 Drawing Sheets

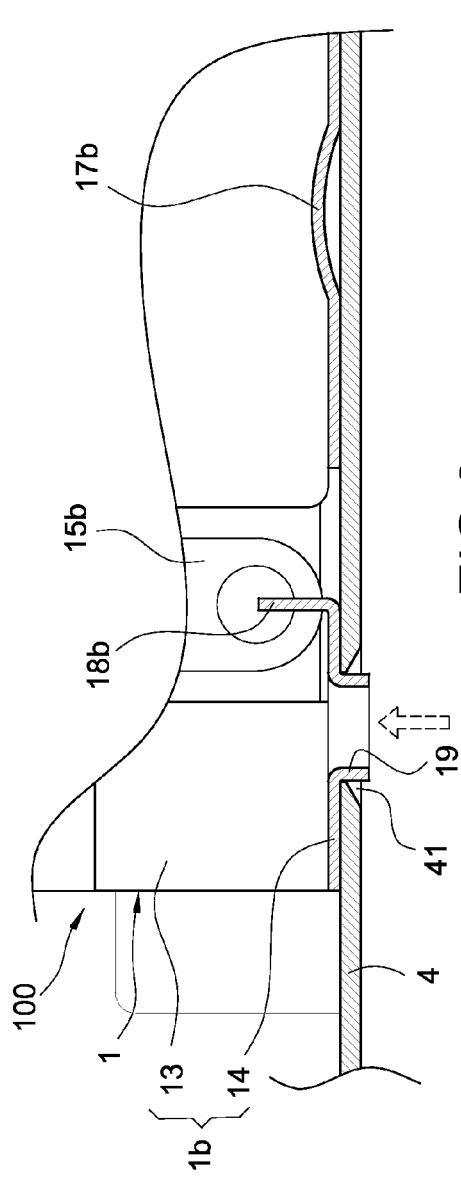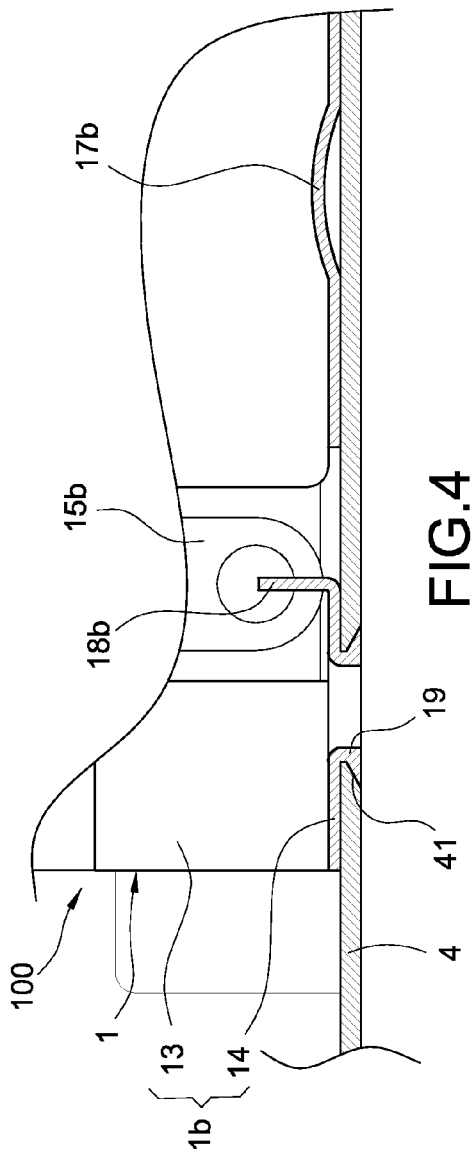

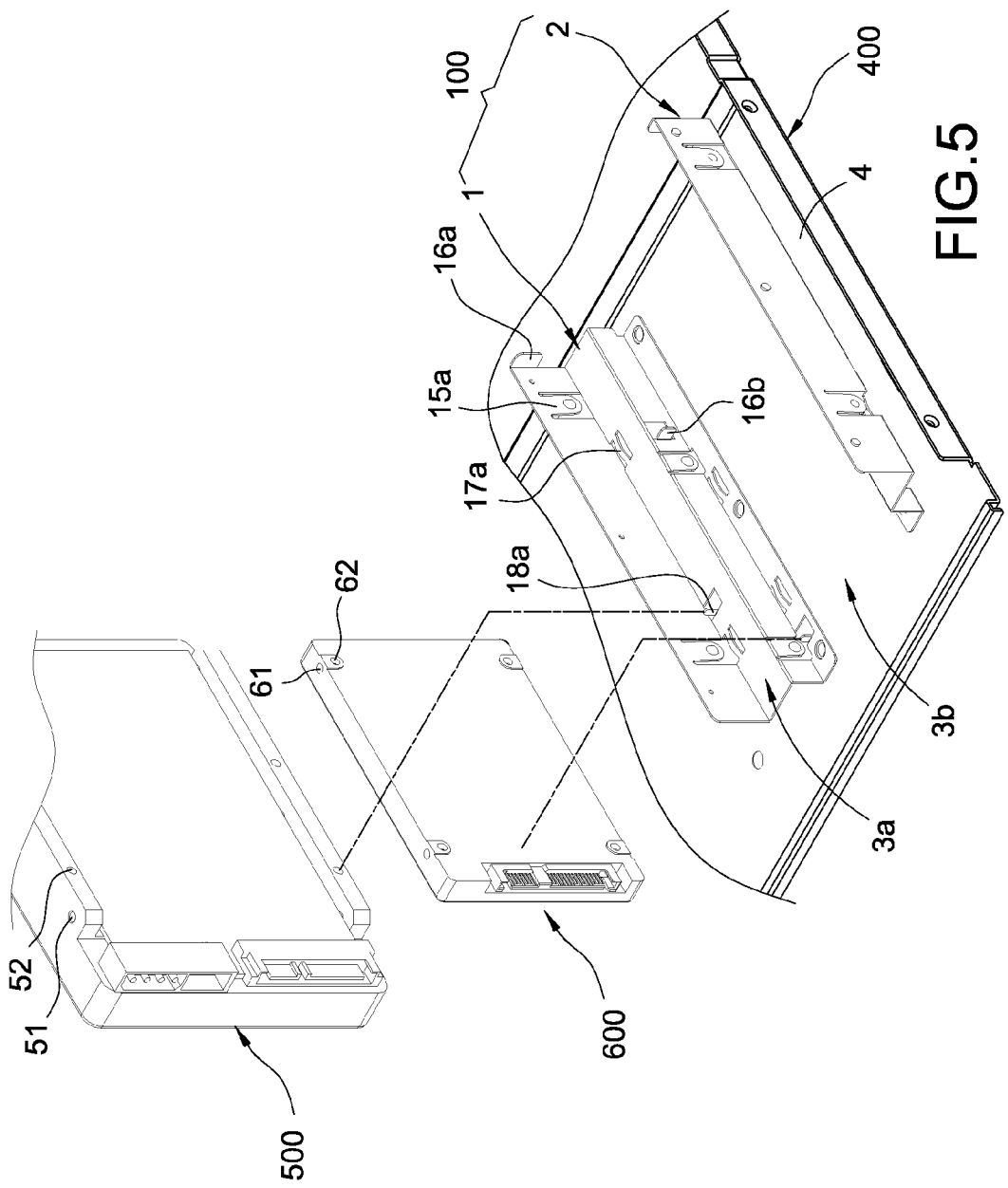

SCREWLESS CARRYING FRAME FOR DATA ACCESS DEVICES

FIELD OF THE INVENTION

The present invention relates to a carrying frame, and more particularly to a screwless carrying frame of a data access device.

BACKGROUND OF THE INVENTION

In general, an industrial computer or server comes with a plurality of data access devices installed in a chassis and provided for several persons to access data at the same time. Each data access device is secured to a carrying frame by screws, and each carrying frame is further secured to a bottom board of the chassis by screws.

When the data access devices are fixed to the chassis, the data access device must be secured to the carrying frame first, and then the carrying frame is secured to the chassis. It takes a number of various screws to secure the data access devices. Sometimes the data access device cannot be secured easily due to the angle or hindrance, not mentioning the trouble of having to install, remove and reinstall the data access device anytime.

In addition, a conventional carrying frame can just carry a single data access device but cannot carry a second piece of data access device on the same carrying frame. Even a carrying frame can carry the second piece of data access device, the two data access device are close to each other and thus making the connection by screw very difficult.

SUMMARY OF THE INVENTION

It is a primary objective of the present invention to provide a screwless carrying frame for data access devices to overcome the trouble and inconvenience of installing the screws by a screwless positioning and packing fixation method and avoid the problem of being hindered during the screwing process.

To achieve the aforementioned objective, the present invention provides a screwless carrying frame of a data access device, mounted onto a bottom board, comprising: a first frame body, installed on the bottom board, and including an upper structure, and the upper structure having an upper vertical plate and an upper transverse plate connected with each other into a step shape, and the upper vertical plate having a plurality of elastic packing elements, and the upper transverse plate having a plurality of elastic support elements; and a second frame body, installed on the bottom board and arranged with an interval apart from and opposite to the first frame body, and the second frame body including an upper structure, and the upper structure having an upper riser plate and an upper horizontal plate connected with each other into a step shape, and an upper carrying space being formed between the upper structure of the first frame body and the upper structure of the second frame body for accommodating the data access device, and the elastic packing elements being elastically packed at a lateral side of the data access device, and the elastic support elements being elastically supported at a bottom side of the data access device.

The present invention further provides a screwless carrying frame for data access devices, comprising: a first frame body, installed on the bottom board, and including an upper structure, and the upper structure having an upper vertical plate and an upper transverse plate connected with each other into a step shape, and the upper vertical plate having a plurality of elastic packing elements, and the upper transverse plate having a plurality of elastic support elements; and a second frame body, installed on the bottom board and arranged with an interval apart from and opposite to the first frame body, and the second frame body including an upper structure, and the upper structure having an upper riser plate and an upper horizontal plate connected with each other into a step shape, and an upper carrying space being formed between the upper structure of the first frame body and the upper structure of the second frame body for accommodating the data access device, and the elastic packing elements being elastically packed at a lateral side of the data access device, and the elastic support elements being elastically supported at a bottom side of the data access device.

The present invention further provides a screwless carrying frame for data access devices, a bottom board; a first frame body, installed on the bottom board, and including an upper structure, and the upper structure having an upper vertical plate and an upper transverse plate connected with each other into a step shape, and the upper vertical plate having a plurality of elastic packing elements, and the upper transverse plate having a plurality of elastic support elements; and a second frame body, installed on the bottom board and arranged with an interval apart from and opposite to the first frame body, and the second frame body including an upper structure, and the upper structure having an upper riser plate and an upper horizontal plate connected with each other into a step shape, and the first frame body and the second frame body being connected with each other, and an upper carrying space being defined between the upper structure of the first frame body and the upper structure of the second frame body for accommodating the data access device, and the elastic packing elements being elastically packed at a lateral side of the data access device, and the elastic support elements being elastically supported at a bottom side of the data access device.

Compared with the prior art, the present invention has the following advantages. The invention can overcome the trouble and inconvenience of installing the screws by a screwless positioning and packing fixation method and avoid the problem of being hindered during the screwing process.

BRIEF DESCRIPTION OF THE DRAWINGS

FIGS. 3 and 4 are cross-sectional views of the present invention according to FIG. 2 before and after the carrying frame is pivotally fixed respectively;

FIG. 5 is a partial exploded view of the present invention according to FIG. 2 before two data access devices are installed;

DESCRIPTION OF THE PREFERRED EMBODIMENTS

Figure 1:
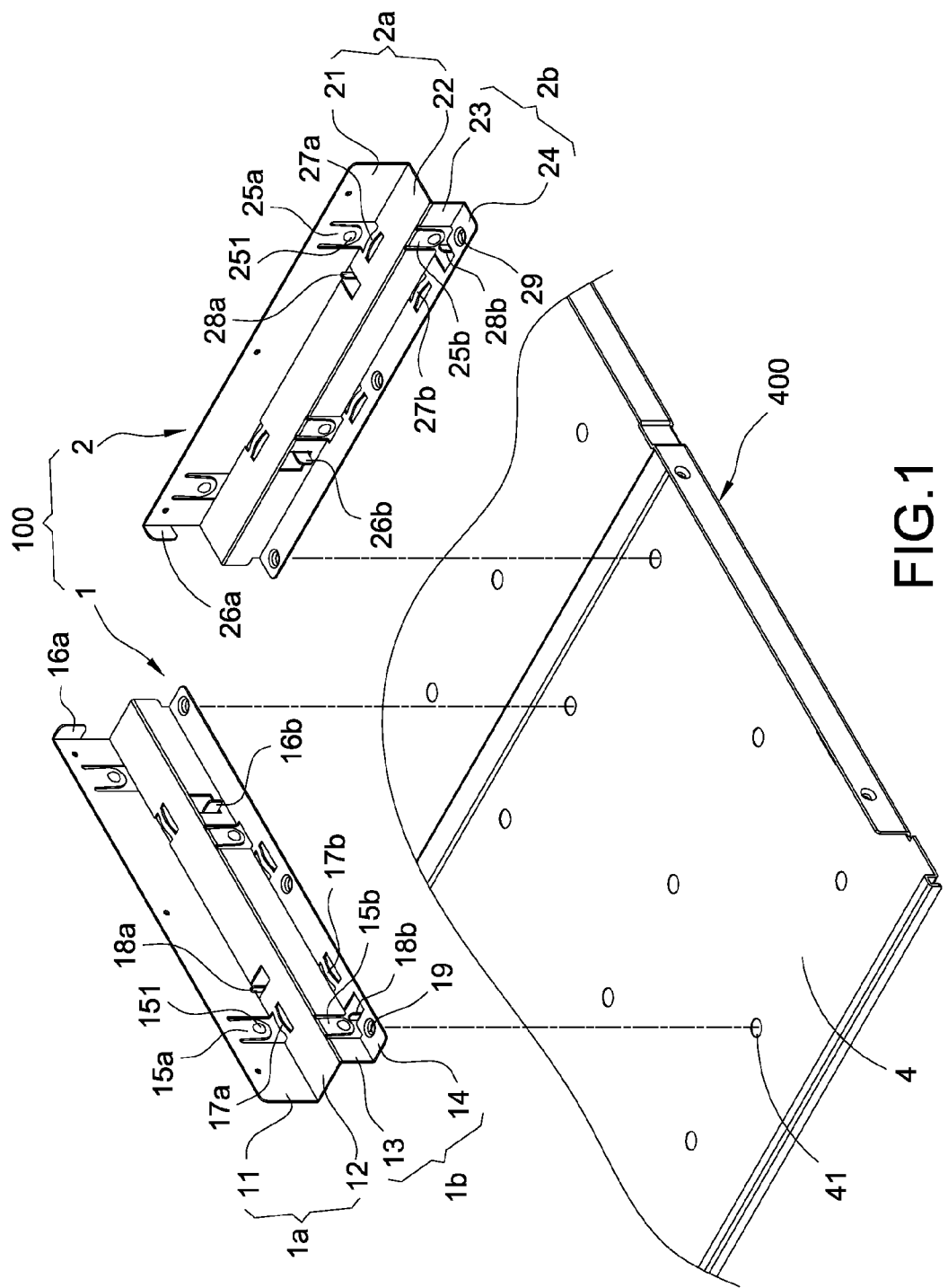
FIG. 1 is an exploded view of a carrying frame of the present invention before the carrying frame is mounted onto a chassis.

The technical contents of the present invention will become apparent with the detailed description of preferred embodiments accompanied with the illustration of related drawings as follows. It is noteworthy that same numerals are used for representing same respective elements in the drawings.

Figure 6:
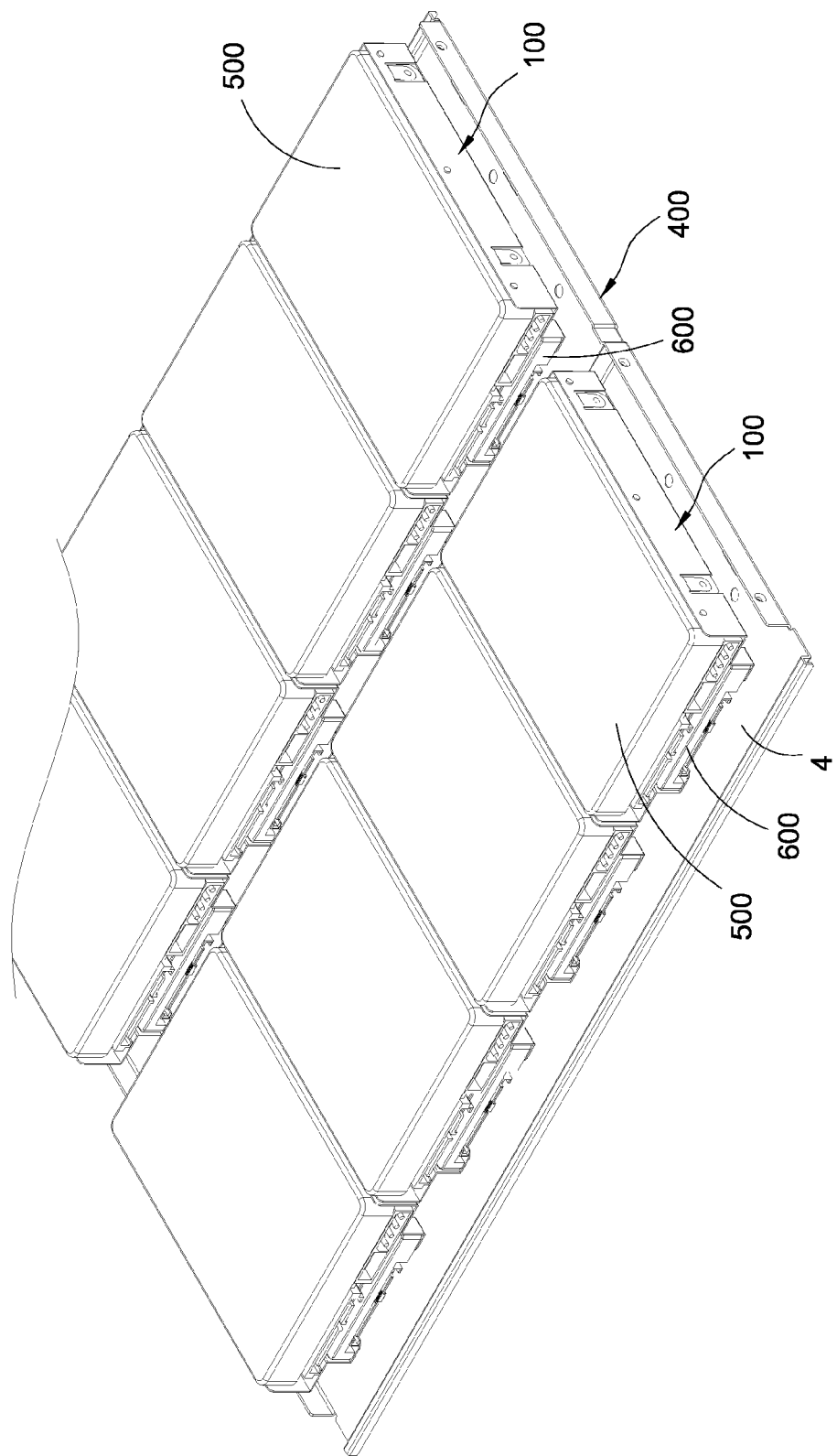
FIG. 6 is a perspective view of a plurality of data access devices installed in a chassis in accordance with the present invention.
Figure 7:
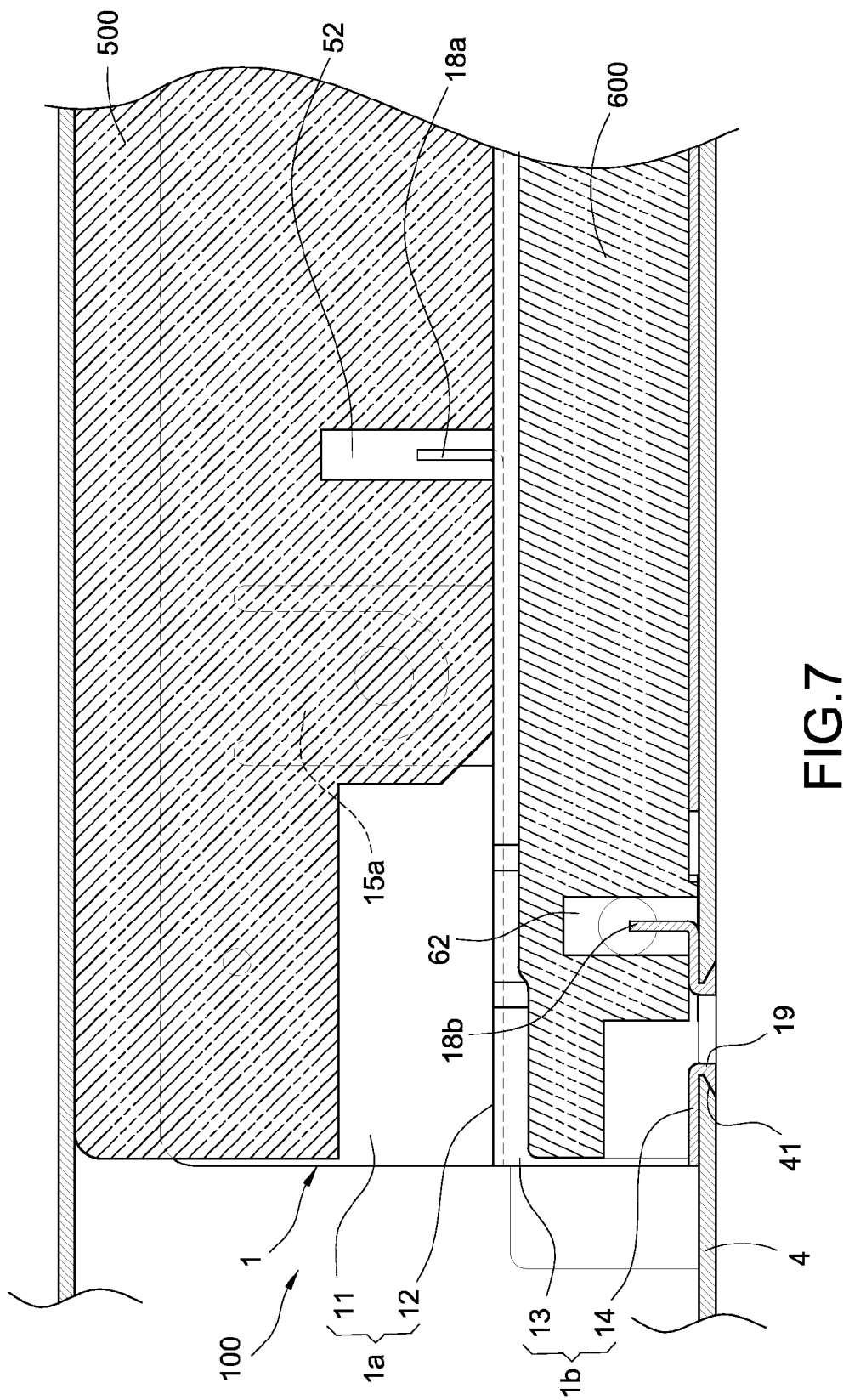
FIG. 7 is a partial cross-sectional view of the present invention according to side view of FIG. 6.
Figure 8:
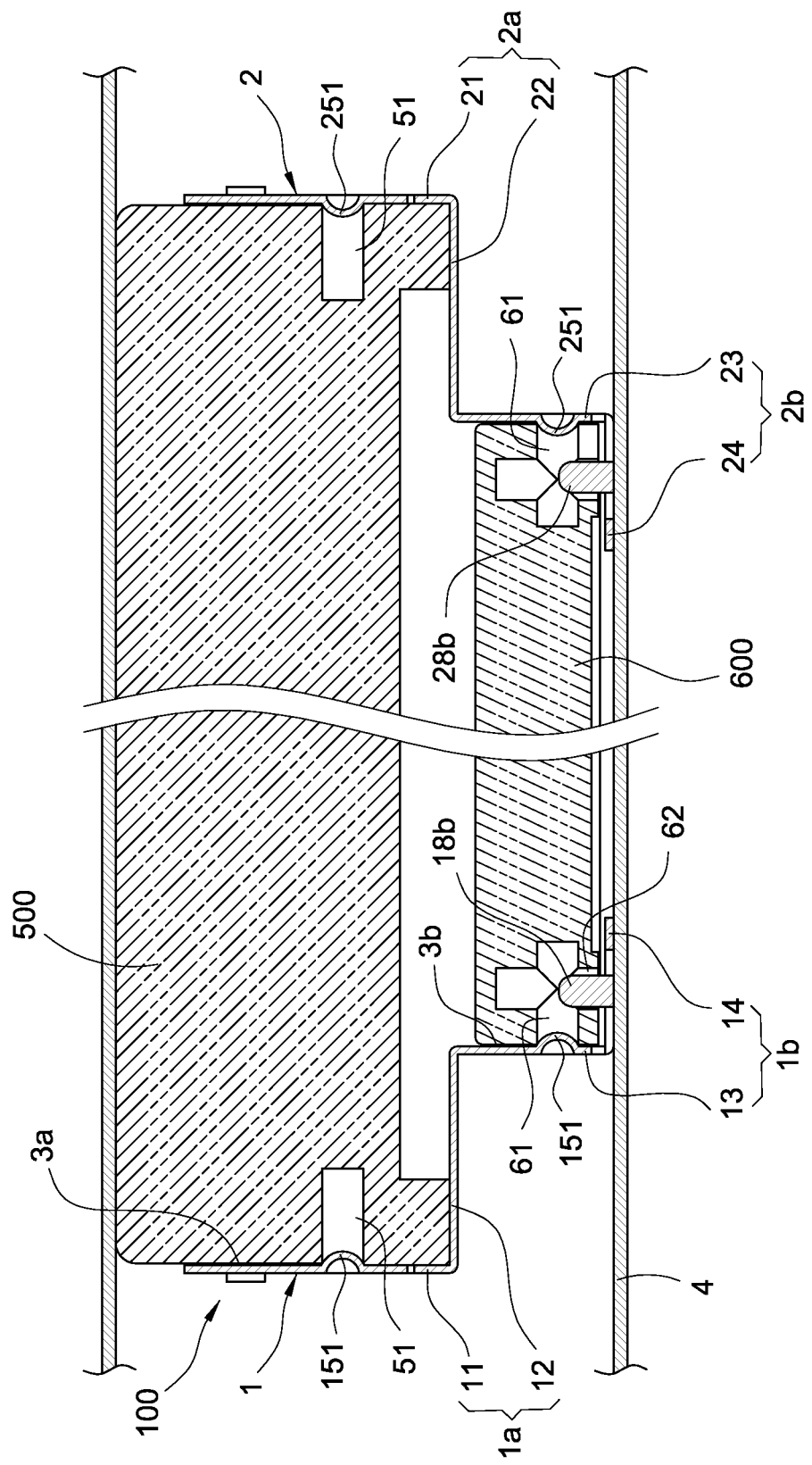
FIG. 8 is a cross-sectional view of the present invention according to FIG. 7 rotated by 90 degrees.

The present invention provides a screwless carrying frame for data access devices as shown in FIG. 6. In a chassis 400 of an industrial computer or server, plural carrying frames 100 of the present invention are installed, and each carrying frame 100 carries a data access device or two data access devices (including a 3.5-inch data access device 500 and a 2.5-inch data access device 600), so that several persons can access data at the same time. The carrying frame 100 of the present invention is mounted onto a bottom board 4 of the chassis 400, and the carrying frame 100 comprises a first frame body 1 and a second frame body 2.

In FIGS. 1 to 4, the first frame body 1 is installed on the bottom board 4 and comprises an upper structure 1a. In this preferred embodiment, the first frame body 1 further comprises a lower structure 1b, and the upper and lower structures 1a, 1b are connected to each other. The upper structure 1a has an upper vertical plate 11 and an upper transverse plate 12 connected with each other into a step shape, and the upper vertical plate 11 has a plurality of elastic packing elements 15a and a bracket 16a, and the elastic packing element 15a is an elastic plate having a bump 151 as shown in the figures, and the bracket 16a is extended and formed by bending an end of upper vertical plate 11. The upper transverse plate 12 has a plurality of elastic support elements 17a and at least one positioning element 18a, and the elastic support element 17a is an arch-shaped bridging elastic plate, and the positioning element 18a is erected from a position of the upper transverse plate 12.

The lower structure 1b of the first frame body 1 is substantially the same as the upper structure 1a, and also has a lower vertical plate 13 and a lower transverse plate 14 connected with each other into a step shape, and a side edge of the upper transverse plate 12 is connected to an upper edge of the lower vertical plate 13, such that the first frame body 1 is formed into a multi-step shape. Same as the upper vertical plate 11, the lower vertical plate 13 also has a plurality of elastic packing elements 15b and a bracket 16b. Same as the upper transverse plate 12, the lower transverse plate 14 also has a plurality of elastic support elements 17b and at least one positioning element 18b, and the lower transverse plate 14 further includes a plurality of rivets 19.

The second frame body 2 is installed at the bottom board 4 with an interval apart from and opposite to the first frame body 1. The structure of the second frame body 2 is disposed opposite to the first frame body 1 and also includes an upper structure 2a and a lower structure 2b, wherein the upper structure 2a has an upper riser plate 21 and an upper horizontal plate 22, and the lower structure 2b has a lower riser plate 23 and a lower horizontal plate 24, and the upper riser plate 21 and the lower riser plate 23 have a plurality of elastic packing elements 25a, 25b and a bracket 26a, 26b respectively, and the upper horizontal plate 22 and the lower horizontal plate 24 have a plurality of elastic support elements 27a, 27b and a positioning element 28a, 28b respectively, and the lower horizontal plate 24 also has a plurality of rivets 29.

Figure 2:
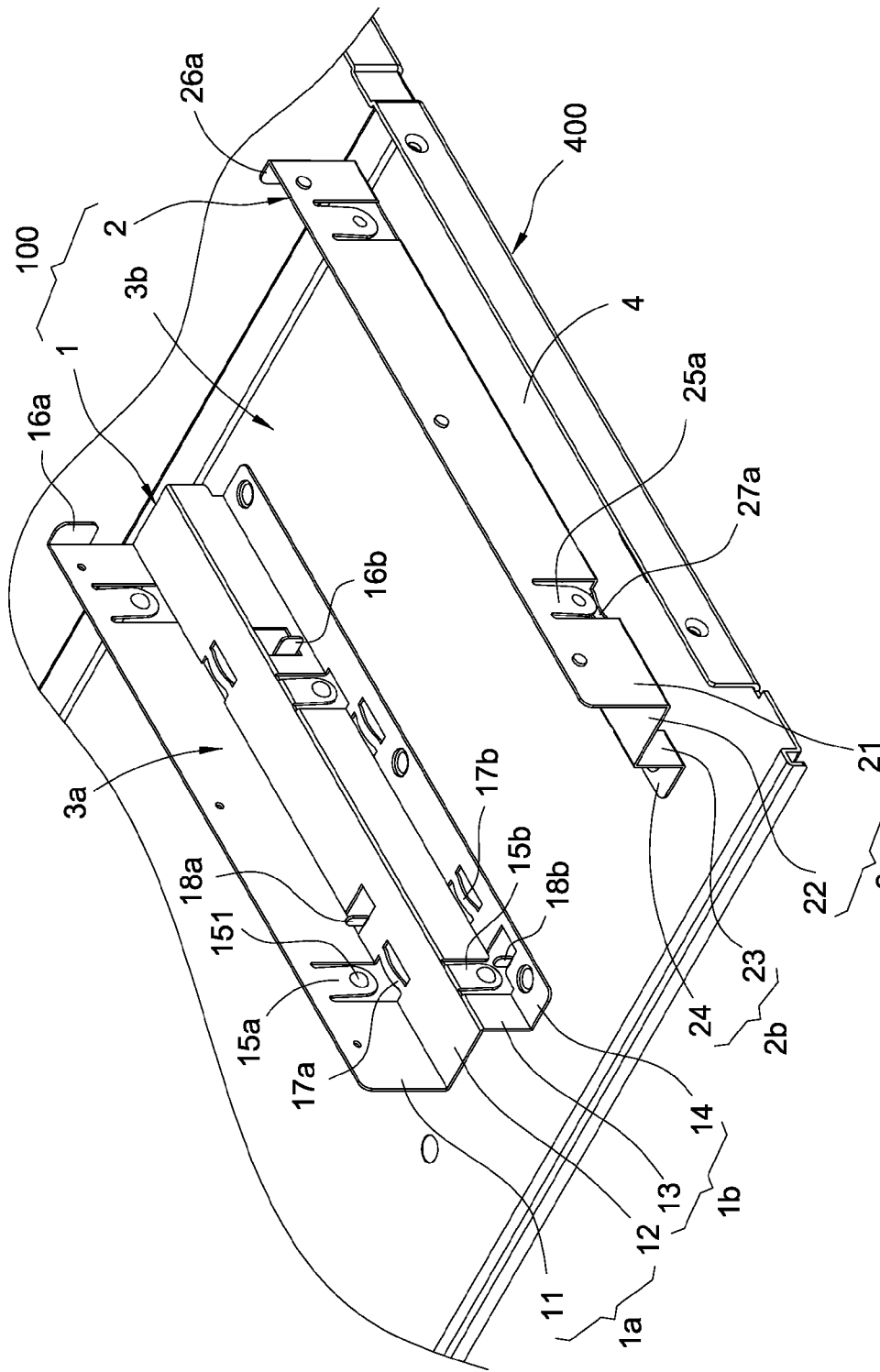
FIG. 2 is a perspective view of the present invention according to FIG. 1.

In FIGS. 2 and 5, the first and second frame bodies 1, 2 are installed on the left and right sides of the bottom board 4, so that an upper carrying space 3a is formed between the two upper structures 1a, 2a, and a lower carrying space 3b is formed between the two lower structures 1b, 2b, wherein the first and second frame bodies 1, 2 are fixed onto the bottom board 4 by installing the rivets 19, 29 into the rivet holes 41 formed on the bottom board 4 (as shown in FIGS. 3 and 4).

Since the bumps 151, 251 of the elastic packing elements 15a, 15b, 25a, 25b are disposed at positions corresponding to the screw holes (which are side screw holes 51, 61 as shown in FIG. 5) formed on the lateral sides of the data access device 500, 600, and the positioning elements 18a, 18b, 28a, 28b are disposed at positions corresponding to the screw holes (which are the bottom screw holes 52, 62 as shown in FIG. 5) formed on the bottom side of data access device 500, 600, and the brackets 16a, 16b, 26a, 26b block the front ends (or rear ends) of the data access devices 500, 600 respectively, so that the upper carrying space 3a can be used for carrying a 3.5-inch data access device 500, and the lower carrying space 600 can be used for carrying a 2.5-inch data access device 600.

In FIGS. 5 to 8, when the upper carrying space 3a carries the data access device 500, the front end (or rear end) of the data access device 500 is blocked by the two brackets 16a, 26a for a preliminary positioning, and the two positioning elements 18a, 28a are inserted into the two bottom screw holes 52 of the data access device 500 for a secondary positioning. The bottom side of the data access device 500 is elastically supported by the plurality of elastic support elements 17a, 27a, and the two opposite lateral sides of the data access device 500 are elastically packed on the left and right sides by the plurality of elastic packing elements 15a and the plurality of elastic packing elements 25a, such that the data access device 500 is packed and fixed between the first and second frame bodies 1, 2 without requiring any screw. In addition, the bumps 151, 251 of the elastic packing elements 15a, 25a are latched into the side screw holes 51 of the data access device 500 for a tertiary positioning. To achieve a better elastic packing effect of the first and second frame bodies 1, 2, the first and second frame bodies 1, 2 are preferably made of galvanized iron.

Since the carrying frame 100 of the present invention has the upper carrying space 3a and the lower carrying space 3b, therefore it can carry two data access devices 500 and 600. The lower carrying space 3b is provided for carrying a 2.5-inch data access device 600 by a packing method, and the upper carrying space 3 is provided for carrying a 3.5-inch data access device 500 by the packing method, so that a single carrying frame 100 can securely carry two data access devices 500, 600 at the same time.

In FIG. 6, the bottom board 4 of the chassis 400 has a plurality of carrying frames 100 of the present invention installed thereon, and each carrying frame 100 can carry two data access devices 500, 600 at the same time, so that the chassis 400 is electrically connected to a plurality of data access devices 500, 600 at the same time. Taking the hard disk as an example, the 2.5-inch data access device 600 can be used as a system disk for system operations, and the 3.5-inch data access device 500 can be used as a data disk for data access.

In practical applications, only one of the first and second frame bodies 1, 2 requires to have the elastic packing elements 15a, 15b (or 25a, 25b) and the elastic support elements 17a, 17b (or 27a, 27b) only. As long as the data access device 500 or 600 can be packed between the first and second frame bodies 1, 2, it is not necessary for both first and second frame bodies to have the elastic packing elements 15a, 15b (or 25a, 25b) and the elastic support elements 17a, 17b (or 27a, 27b). If it is not necessary to carry two data access devices at the same time, then the first frame body 1 and the second frame body 2 can be composed of the upper structure 1a and 2a only.

In addition, a one-piece carrying frame (not shown in the figure) can be connected and formed between a side edge of the lower transverse plate 14 of the first frame body 1 and a side edge of the lower horizontal plate 24 of the second frame body 2. The present invention is not limited to the two-piece carrying frame 100 as shown in the figures.

In summation of the description above, the present invention has the following advantage over the prior art. The screwless positioning and packing fixation method can overcome the trouble and inconvenience of installing the screws and avoid the problem of being hindered during the screwing process.

In addition, the present invention further has another effect. The first and second frame bodies 1, 2 with a stairway design allows the carrying frame 100 to carry two data access devices at the same time.

While the invention has been described by means of specific embodiments, numerous modifications and variations could be made thereto by those skilled in the art without departing from the scope and spirit of the invention set forth in the claims.

What is claimed is:

1. A screwless carrying frame for data access devices, mounted onto a bottom board, comprising:
   a first frame body, installed on the bottom board, and including an upper structure, and the upper structure having an upper vertical plate and an upper transverse plate connected with each other into a step shape, and the upper vertical plate having a plurality of elastic packing elements, and the upper transverse plate having a plurality of elastic support elements; and
   a second frame body, installed on the bottom board and arranged with an interval apart from and opposite to the first frame body, and the second frame body including an upper structure, and the upper structure having an upper riser plate and an upper horizontal plate connected with each other into a step shape, and an upper carrying space being formed between the upper structure of the first frame body and the upper structure of the second frame body for accommodating the data access device, and the elastic packing elements being elastically packed at a lateral side of the data access device, and the elastic support elements being elastically supported at a bottom side of the data access device,
   wherein each of the upper transverse plate of the first frame body and the upper horizontal plate of the second frame body has at least one positioning element, and the two positioning elements are inserted into two screw holes formed on the bottom side of the data access device.

2. The screwless carrying frame for data access devices according to claim 1, wherein each of the first and second frame bodies further comprises a lower structure, and the lower structure of the first frame body has a lower vertical plate and a lower transverse plate connected with each other into a step shape, and the lower structure of the second frame body has a lower riser plate and a lower horizontal plate connected with each other into a step shape, and a side edge of the upper transverse plate is connected to an upper edge of the lower vertical plate, and a side edge of the upper horizontal plate is connected to an upper edge of the lower riser plate, and the lower vertical plate has a plurality of elastic packing elements, and the lower transverse plate has a plurality of elastic support elements, and a lower carrying space is formed between the lower structure of the first frame body and the lower structure of the second frame body for accommodating another data access device, and the lower transverse plate and the lower horizontal plate are installed on the bottom board.

3. The screwless carrying frame for data access devices according to claim 2, wherein the upper carrying space has a width greater than the width of the lower carrying space.

4. The screwless carrying frame for data access devices according to claim 2, wherein the second frame body is installed in the same way as the first frame body and further includes a plurality of elastic packing elements and a plurality of elastic support elements.

5. The screwless carrying frame for data access devices according to claim 1, wherein the second frame body is installed in the same way as the first frame body and further includes a plurality of elastic packing elements and a plurality of elastic support elements.

6. The screwless carrying frame for data access devices according to claim 1, wherein each of the upper vertical plate of the first frame body and the upper riser plate of the second frame body has a bracket, and a front side or a rear side of the data access device is blocked by the two brackets.

7. The screwless carrying frame for data access devices according to claim 1, wherein each elastic support element is an arch-shaped bridging elastic plate.

8. A screwless carrying frame for data access devices, mounted onto a bottom board, comprising:
   a first frame body, installed on the bottom board, and including an upper structure, and the upper structure having an upper vertical plate and an upper transverse plate connected with each other into a step shape, and the upper vertical plate having a plurality of elastic packing elements, and the upper transverse plate having a plurality of elastic support elements; and
   a second frame body, installed on the bottom board and arranged with an interval apart from and opposite to the first frame body, and the second frame body including an upper structure, and the upper structure having an upper riser plate and an upper horizontal plate connected with each toher into a step shape, and an upper carrying space being formed between the upper structure of the first frame body and the upper structure of the second frame body for accommodating the data access device, and the elastic packing elements being elastically packed at a lateral side of the data access device, and the elastic support elements being elastically supported at a bottom side of the data access device,
   wherein each elastic packing element has an elastic plate, and the elastic plate has a bump, and the bump is latched into a screw hole formed on a lateral side of the data access device.

9. A screwless carrying frame for data access devices, comprising:
   a first frame body, including an upper structure, and the upper structure having an upper vertical plate and an upper transverse plate connected with each other into a step shape, and the upper vertical plate having a plurality of elastic packing elements, and the upper transverse plate having a plurality of elastic support elements; and
   a second frame body, connected with an interval apart and opposite to the first frame body, and having an upper structure, and the upper structure having an upper riser plate and an upper horizontal plate connected with each other into a step shape, and an upper carrying space being formed between the upper structure of the first frame body and the upper structure of the second frame body for accommodating the data access device, and the elastic packing elements being elastically packed at a lateral side of the data access device, and the elastic support elements being elastically supported at a bottom side of the data access device,
   wherein each of the upper transverse plate of the first frame body and the upper horizontal plate of the second frame body has at least one positioning element, and the two positioning elements are inserted into two screw holes formed on a bottom side of the data access device respectively.

10. The screwless carrying frame for data access devices according to claim 9, wherein each of the first frame body and the second frame body further includes a lower structure, and the lower structure of the first frame body has a lower vertical plate and a lower transverse plate connected with each other into a step shape, and the lower structure of the second frame body has a lower riser plate and a lower horizontal plate connected with each other into a step shape, and a side edge of the upper transverse plate is connected to an upper edge of the lower vertical plate, and a side edge of the upper horizontal plate is connected to an upper edge of the lower riser plate, and the lower transverse plate of the first frame body and the lower horizontal plate of the second frame body are connected with each other, and the lower vertical plate has a plurality of elastic packing elements, and the lower transverse plate has a plurality of elastic support elements, and a lower carrying space is formed between the lower structure of the first frame body and the lower structure of the second frame body for accommodating another data access device.

11. The screwless carrying frame for data access devices according to claim 10, wherein the upper carrying space has a width greater than the width of the lower carrying space.

12. The screwless carrying frame for data access devices according to claim 10, wherein the second frame body is installed the same way as the first frame body and further includes a plurality of elastic packing elements and a plurality of elastic support elements.

13. The screwless carrying frame for data access devices according to claim 9, wherein the second frame body is installed the same way as the first frame body and further includes a plurality of elastic packing elements and a plurality of elastic support elements.

14. The screwless carrying frame for data access devices according to claim 9, wherein each of the upper vertical plate of the first frame body and the upper riser plate of the second frame body has a bracket, and a front side or a rear side of the data access device is blocked by the two brackets.

15. The screwless carrying frame for data access devices according to claim 9, wherein each elastic support element is an arch-shape bridging elastic plate.

16. A screwless carrying frame for data access devices, comprising:
  a first frame body, including an upper structure, and the upper structure having an upper vertical plate and an upper transverse plate connected with each other into a step shape, and the upper vertical plate having a plurality of elastic packing elements, and the upper transverse plate having a plurality of elastic support elements; and
  a second frame body, connected with an interval apart and opposite to the first frame body, and having an upper structure, and the upper structure having an upper riser plate and an upper horizontal plate connected with each other into a step shape, and an upper carrying space being formed between the upper structure of the first frame body and the upper structure of the second frame body for accommodating the data access device, and the elastic packing elements being elastically packed at a lateral side of the data access device, and the elastic support elements being elastically supported at a bottom side of the data access device,
  wherein each elastic packing element is an elastic plate, and the elastic plate has a bump, and the bump is latched into a screw hole formed on a lateral side of the data access device.

* * * * *